United States Patent
Zhou et al.

(10) Patent No.: US 10,263,057 B2
(45) Date of Patent: Apr. 16, 2019

(54) ORGANIC LIGHT EMITTING DISPLAY PANEL AND MANUFACTURING METHOD THEREOF

(71) Applicant: Shenzhen China Star Optoelectronics Technology Co., Ltd., Shenzhen, Guangdong (CN)

(72) Inventors: Xingyu Zhou, Guangdong (CN); Shipeng Chi, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 66 days.

(21) Appl. No.: 15/504,473

(22) PCT Filed: Jan. 18, 2017

(86) PCT No.: PCT/CN2017/071590
§ 371 (c)(1),
(2) Date: Feb. 16, 2017

(87) PCT Pub. No.: WO2018/113066
PCT Pub. Date: Jun. 28, 2018

(65) Prior Publication Data
US 2018/0226462 A1    Aug. 9, 2018

(30) Foreign Application Priority Data

Dec. 22, 2016    (CN) .......................... 2016 1 1196057

(51) Int. Cl.
*H01L 27/32* (2006.01)
*H01L 21/82* (2006.01)
(Continued)

(52) U.S. Cl.
CPC .......... *H01L 27/3262* (2013.01); *H01L 21/82* (2013.01); *H01L 27/1225* (2013.01);
(Continued)

(58) Field of Classification Search
CPC . H01L 27/32; H01L 27/3262; H01L 27/1225; H01L 29/78675; H01L 29/7869
See application file for complete search history.

(56) References Cited

U.S. PATENT DOCUMENTS

2008/0042946 A1* 2/2008 Park ..................... G09G 3/3275
345/82
2016/0005383 A1* 1/2016 Lee ...................... G09G 3/3291
345/690
2016/0093247 A1* 3/2016 Lim ..................... G09G 3/2003
345/694

FOREIGN PATENT DOCUMENTS

CN            102280491 A          12/2011
CN            103715196 A           4/2014
(Continued)

*Primary Examiner* — Phuc Dang
(74) *Attorney, Agent, or Firm* — Andrew C. Cheng

(57) ABSTRACT

The present disclosure discloses an OLED panel, including: a substrate and a driving thin film transistor, a switching thin film transistor, a storage capacitor, an organic light emitting device, and a light emitting device formed on the substrate, an external voltage signal is stored in the storage capacitor via the switching thin film transistor, the external voltage signal controls a magnitude of on-current of the driving thin film transistor to control the gray scale of the organic light emitting device. The present disclosure further discloses a manufacturing method of OLED panel. In the present disclosure, the drain of the low temperature polysilicon thin film transistor is in contact with the bottom electrode of the organic light emitting device so that the current supplied to the organic light emitting device is stabilized; metal-oxide-semiconductor thin-film transistor has a low leakage current, so that a better circuit-closing effect can be achieved.

19 Claims, 8 Drawing Sheets

(51) Int. Cl.
*H01L 29/786* (2006.01)
*H01L 27/12* (2006.01)

(52) U.S. Cl.
CPC .... *H01L 29/7869* (2013.01); *H01L 29/78675* (2013.01); *H01L 2227/323* (2013.01)

(56) References Cited

FOREIGN PATENT DOCUMENTS

| | | |
|---|---|---|
| CN | 104538401 A | 4/2015 |
| CN | 105612620 A | 5/2016 |
| CN | 105931988 A | 9/2016 |
| WO | WO2010131827 A1 | 11/2010 |

* cited by examiner

ORGANIC LIGHT EMITTING DISPLAY PANEL AND MANUFACTURING METHOD THEREOF

FIELD OF THE DISCLOSURE

The present disclosure relates to an organic light emitting display technology field, and more particularly to an organic light emitting display panel and a manufacturing method thereof.

BACKGROUND OF THE DISCLOSURE

In recent years, organic light-emitting diodes (OLED) display panel has become a very popular emerging flat panel display products at home and abroad, because OLED display panel has a self-luminous, wide viewing angle (up to 175°), short response time (1 μs), high luminous efficiency, wide color gamut, low operating voltage (3~10V), thin thickness (less than 1 mm), can produce large size and flexible panel and process characteristics, but also has the potential of low cost.

The existing OLED display panel can be divided into a passive OLED display panel (PM-OLED) and an active OLED display panel (AM-OLED) according to the driving method. In active OLED display panels, thin-film transistors (TFTs) are commonly used to store OLED signals with capacitances to control the luminance grayscale representation of OLEDs. In order to achieve constant current drive purposes, each pixel requires at least two TFT and a storage capacitor to form. However, these two TFTs are generally of the same type, such as metal-oxide-semiconductor thin-film transistors or low-temperature polysilicon thin-film transistors. However, when metal oxide semiconductor thin film transistors are used as the driving thin film transistors, the current supplied to the OLEDs by the metal oxide semiconductor thin film transistors may become unstable, resulting in unstable light emission of the OLEDs; when a low-temperature polysilicon thin-film transistor is used as a switching thin-film transistor for introducing an externally applied voltage signal, the leakage of the low-temperature polysilicon thin-film transistor is high, thereby failing to achieve a superior circuit-closing effect.

SUMMARY OF THE DISCLOSURE

In order to solve the above-mentioned problems of the prior art, it is an object of the present disclosure to provide an organic light emitting display panel and a method for fabricating the same capable of simultaneously achieving a stable OLED emission and a superior circuit shut-off effect.

According to an aspect of the present disclosure, there is provided an organic light emitting display panel including: a substrate; and a driving thin film transistor, a switching thin film transistor, a storage capacitor, an organic light emitting device, and a light emitting device formed on the substrate, an external voltage signal is stored in the storage capacitor via the switching thin film transistor, the external voltage signal controls a magnitude of on-current of the driving thin film transistor to control the gray scale of the organic light emitting device. The driving thin film transistor is a low temperature polysilicon thin film transistor, and the switching thin film transistor is a metal oxide semiconductor thin film transistor.

Further, the low temperature polysilicon thin film transistor is a P type low temperature polysilicon thin film transistor, the metal oxide semiconductor thin film transistor is an N type metal oxide semiconductor thin film transistor.

According to an aspect of the present disclosure, there is also provided a method of fabricating the above organic light emitting display panel, including: forming a polysilicon layer and a metal oxide semiconductor layer on a substrate; forming a gate insulating layer on the substrate, the polysilicon layer and the metal oxide semiconductor layer; forming a first gate electrode, a second gate electrode and a first storage capacitor electrode on the gate insulating layer; forming a first source contact and a first drain contact on both ends of the polysilicon layer and forming a second source contact and a second drain contact at both ends of the metal oxide semiconductor layer, respectively; forming an interlayer insulating layer on the gate insulating layer, the first gate, the second gate, and the first storage capacitor electrode; forming a first source, a first drain, a second source, a second drain and a second storage capacitor electrode on the interlayer insulating layer; the first source, the first drain, the second source and the second drain penetrating through the interlayer insulating layer and the gate insulating layer to make contact with the corresponding first source contact, first drain contact, second source contact and second drain contact, respectively; forming a flat layer on the interlayer insulating layer, the first source electrode, the first drain electrode, the second source electrode, the second drain electrode, and the second storage capacitor electrode; forming a bottom electrode on the flat layer; the bottom electrode penetrating the flat layer to make contact with the first drain; forming a pixel limiting layer on the flat layer and the bottom electrode, and forming a recess exposing the bottom electrode in the pixel limiting layer; sequentially forming an organic electroluminescent device and a top electrode on the exposed bottom electrode.

Optionally, forming a buffer layer on the substrate before forming the polysilicon layer and the metal oxide semiconductor layer on the substrate.

Optionally, forming a passivation layer on the interlayer insulating layer, the first source, the first drain, the second source, the second drain, and the second storage capacitor electrode before forming the flat layer.

Optionally, the method of forming the polysilicon layer and the metal oxide semiconductor layer on the substrate includes the steps of: depositing an amorphous silicon layer on the substrate; annealing the amorphous silicon layer to recrystallize, thereby forming a polysilicon layer; depositing a metal oxide semiconductor layer separated from the polysilicon layer on the substrate.

Optionally, after forming the gate insulating layer on the substrate, the polysilicon layer, and the metal oxide semiconductor layer, thinning a portion of the gate insulating layer opposite to the polysilicon layer or a portion of the gate insulating layer opposite to the metal oxide semiconductor layer.

Optionally, the method of forming the first gate electrode, the second gate electrode, and the first storage capacitor electrode on the gate insulating layer includes the following steps: depositing a gate metal layer on the gate insulating layer; coating a photoresist on the gate metal layer; exposing and developing the resist to remove the photoresistance other than the photoresist on the first gate, the second gate, and the first storage capacitor electrode to be formed; etching away the exposed gate metal layer.

Optionally, the method of manufacturing the first source contact, the first drain contact, the second source contact and the second drain contact includes the following steps: respectively ion implanting the two ends of the polysilicon layer and the two ends of the metal oxide semiconductor layer; removing the photo resistance on the first gate electrode, the second gate electrode and the first storage capacitor electrode; heating and activating the polysilicon layer and the metal oxide semiconductor layer after ion implantation, so that the first source contact and the first drain contact are formed at both ends of the polysilicon layer, and the second source contact and the second drain contact are formed at both ends of the metal oxide semiconductor layer, respectively.

Optionally, in the step of ion implanting both ends of the polysilicon layer and the two ends of the metal oxide semiconductor layer, the ions used are boron ions.

Advantageous effects of the present disclosure: in the disclosure, the low-temperature polysilicon thin film transistor is used as the driving thin film transistor, and the drain electrode of the thin film transistor is in contact with the bottom electrode of the OLED, so that the current supplied to the OLED is stable, and the metal oxide semiconductor thin film transistor is used as a switching thin film transistor for introducing an externally supplied voltage signal, the leakage of the metal oxide semiconductor thin film transistor is low, so that a more excellent circuit closing effect can be achieved. In addition, the metal-oxide-semiconductor thin-film transistor, although poor reliability of light, but its only as a switching thin film transistor light reliability is poor for the entire device is small, and low-temperature polysilicon thin film transistor light reliability is better, so no need to produce a shading layer on the substrate; and both are top-gate structure, it will not increase the process steps, and parasitic capacitance are relatively small.

BRIEF DESCRIPTION OF THE DRAWINGS

The above and other aspects, features and advantages of the embodiments of the present disclosure will become more apparent from the following description taken in conjunction with the accompanying drawings in which.

DETAILED DESCRIPTION OF PREFERRED EMBODIMENTS

Figure 1:
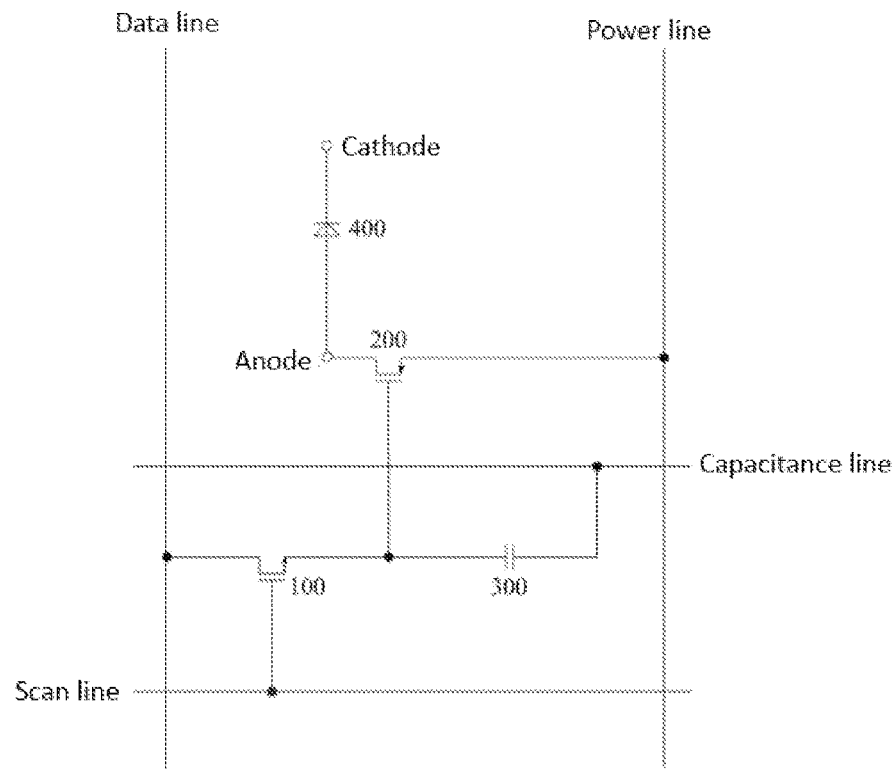
FIG. 1 is a pixel circuit diagram of the OLED display panel of the embodiment of the present disclosure.

Hereinafter, embodiments of the present disclosure will be described in detail with reference to the drawings. The present disclosure may, however, be embodied in many different forms and should not be construed as limited to the specific embodiments set forth herein. Rather, these embodiments are provided to explain the principles of the disclosure and its practical application so as to enable others skilled in the art to understand various embodiments of the disclosure and various modifications as are suited to the particular use contemplated.

In the drawings, the thicknesses of the layers and regions are exaggerated for clarity of the device. Like reference numerals refer to the same components throughout the specification and the drawings.

FIG. 1 is a pixel circuit diagram of the OLED display panel of the embodiment of the present disclosure;

Refer to FIG. 1, in the active OLED display panel, active drive mode is a TFT and storage capacitor to control the brightness of pixels, when the scan line is turned on, the external circuit into the voltage signal through the data lines and switching TFT 100 stored in the storage capacitor 300, the voltage signal controls the magnitude of the on-current of the driving TFT 200, which determines the grayscale of the OLED 400, when the scanning line is turned off, the voltage stored in the storage capacitor 300 can keep the driving TFT 200 in the ON state, so that a fixed current can be provided for the OLED for one picture time.

In the present embodiment, the driving TFT 200 is a low-temperature polysilicon thin-film transistor, and the switching TFT 100 is a metal-oxide-semiconductor thin-film transistor. Further, the low-temperature polysilicon thin-film transistor is a P-type low-temperature polysilicon thin-film transistor, and the metal-oxide-semiconductor thin-film transistor is an N-type metal-oxide-semiconductor thin-film transistor.

A method of manufacturing the OLED display panel of the present embodiment will be described below. FIG. 2A to FIG. 2L are flowcharts of fabrication of the OLED display panel of the embodiment of the present disclosure. It should be noted, in the FIG. 2A to FIG. 2L, for convenience of illustration, the scanning lines, the data lines, the power supply lines, and the capacitance lines in FIG. 1 are not shown, and these omitted elements are present in the actual OLED display panel.

Figure 2A:
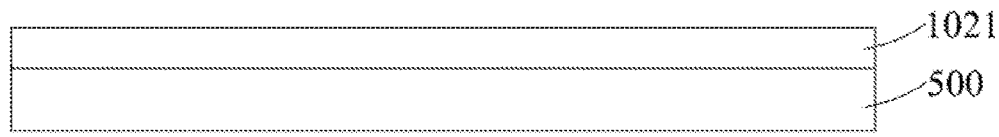
FIG. 2A to FIG. 2L are flowcharts of fabrication of the OLED display panel of the embodiment of the present disclosure.

The manufacturing method of OLED display panel according to the embodiment of the present disclosure includes:

Step 1: refer to FIG. 2A, forming a buffer layer 1021 on the substrate 500. It is to be noted that, as another embodiment of the present disclosure, this step may be omitted if the buffer layer 1021 is not required in accordance with the actual demand.

Here, the substrate 500 may be, for example, an insulating and transparent glass substrate or a resin substrate. The buffer layer 1021 may be, for example, a SiNx/SiOx structure formed on a substrate 500 by a PECVD process or the like, but the present disclosure is not limited thereto. For example, the buffer layer 1021 may be a single-layer SiNx structure or SiOx structure.

Figure 2B:
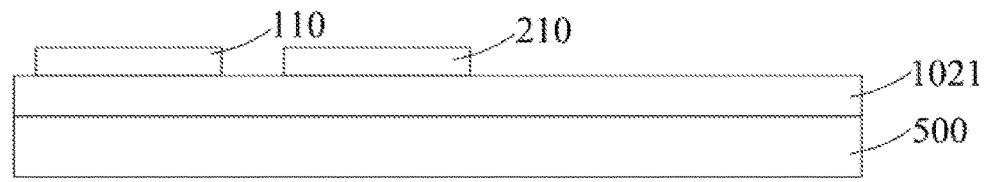
Figure 3A:
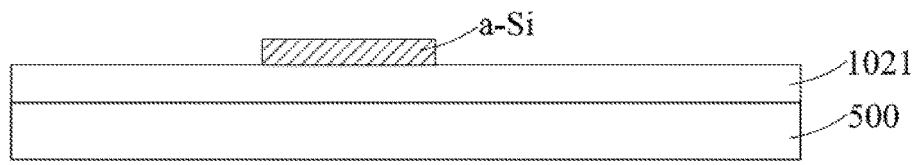
FIG. 3A to FIG. 3C show a flow chart of the fabrication of a polysilicon layer and a metal oxide semiconductor layer of the embodiment of the present disclosure.
Figure 3B:
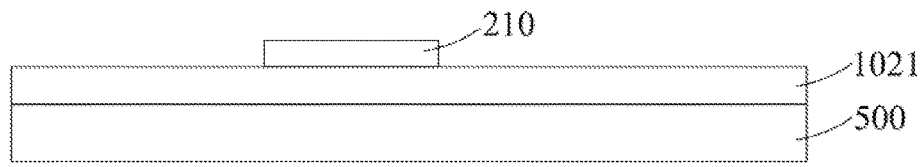
Figure 3C:
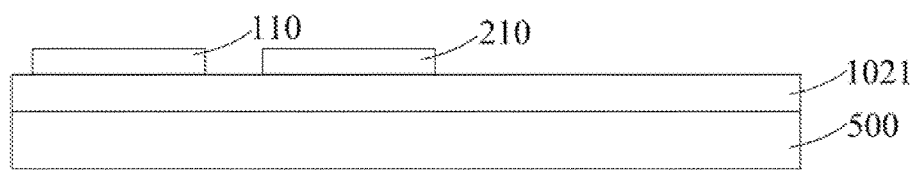

Step 2: refer to FIG. 2B, forming a separated polysilicon layer 210 and a metal oxide semiconductor layer 110 on the buffer layer 1021. FIG. 3A to FIG. 3C show a flow chart of the fabrication of a polysilicon layer 210 and a metal oxide semiconductor layer 110 of the embodiment of the present disclosure.

First, with reference to FIG. 3A, the amorphous silicon layers a-Si are deposited on the buffer layer 1021. Here, an amorphous silicon layer a-Si may be formed on the surface of the buffer layer 1021 by sputtering, for example.

Then, refer to FIG. 3B, the amorphous silicon layer a-Si is recrystallized in an annealing manner, thereby forming the polysilicon layer 210. In this way, Finally, refer to FIG. 3C, depositing a metal oxide semiconductor layer 110 separated from the polysilicon layer 210 on the buffer layer 1021. Here, the metal oxide semiconductor layer 110 may be made of, for example, a metal oxide material such as indium gallium zinc oxide (IGZO), indium tin zinc oxide (ITZO) or the like.

Figure 2C:
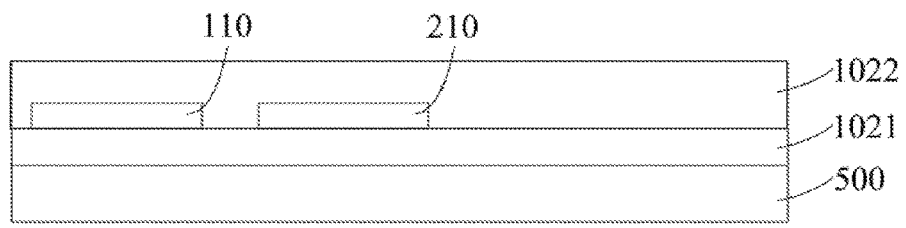

Step 3: refer to FIG. 2C, forming a gate insulating layer 1022 on the buffer layer 1021, the polysilicon layer 210, and the metal oxide semiconductor layer 110. Here, the gate insulating layer 1022 may be, for example, a SiNx/SiOx structure formed on the buffer layer 1021, the polysilicon layer 210, and the metal oxide semiconductor layer 110 by a PECVD process, the present disclosure is not limited thereto. For example, the gate insulating layer 1022 may have a single-layer SiNx structure or SiOx structure.

In step 3, the corresponding gate insulating layer 1022 can be thinned according to the difference in the concentration of ions implanted during the subsequent implantation of the polysilicon layer 210 and the metal oxide semiconductor layer 110, the gate insulating layer 1022 opposite to the polysilicon layer 210 is thinned, for example, when the ion concentration of the injected polysilicon layer 210 is higher than the ion concentration of the implanted metal oxide semiconductor layer 110, when the ion concentration of the implanted polysilicon layer 210 is lower than the ion concentration of the implanted metal oxide semiconductor layer 110, the gate insulating layer 1022 opposite to the metal oxide semiconductor layer 110 is thinned.

Figure 2D:
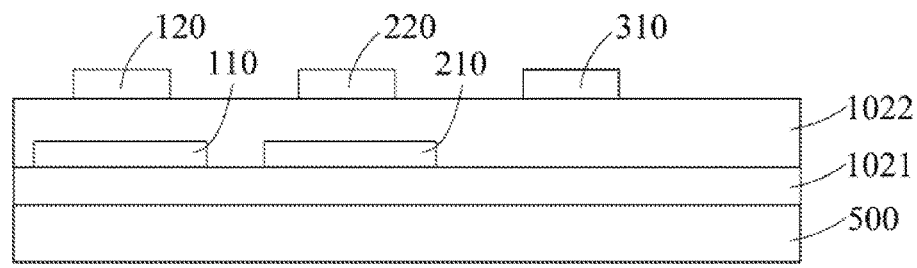

Step 4: refer to FIG. 2D, forming the first gate electrode 220, the second gate electrode 120, and the first storage capacitor electrode 310 on the gate insulating layer 1022. FIG. 4A to FIG. 4D are flowcharts of fabrication of a first gate, a second gate, and a first storage capacitor electrode of the embodiment of the present disclosure.

Figure 4A:
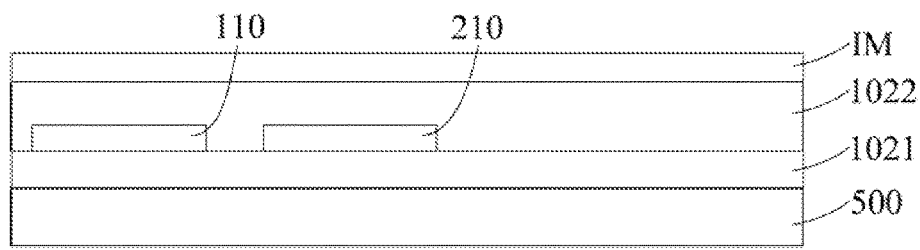
FIG. 4A to FIG. 4D are flowcharts of fabrication of a first gate, a second gate, and a first storage capacitor electrode of the embodiment of the present disclosure.

First, refer to FIG. 4A, depositing the gate metal layer IM on the gate insulating layer 1022. The gate metal layer IM may be, for example, a molybdenum-aluminum-molybdenum (MoAlMo) structure or a titanium-aluminum-titanium (TiAlTi) structure, or may be a single-layer molybdenum structure or a single-layered aluminum structure.

Figure 4B:
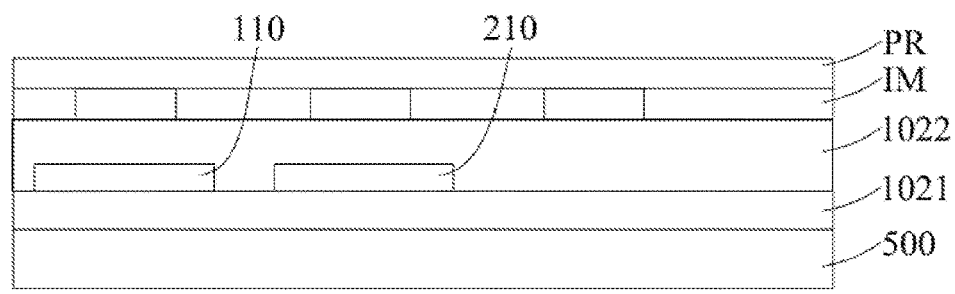

Then, refer to FIG. 4B, coating a photoresist PR on the gate metal layer IM.

Figure 4C:
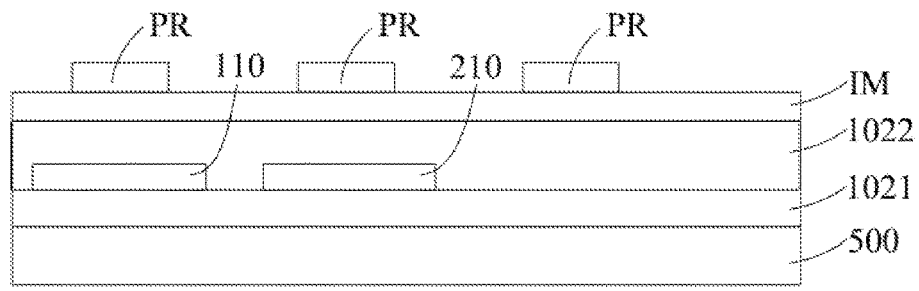

Then, refer to FIG. 4C, exposing and developing the resist PR to remove the photo resistance PR other than the photoresist PR on the first gate 220, the second gate 210, and the first storage capacitor electrode 310 to be formed.

Figure 4D:
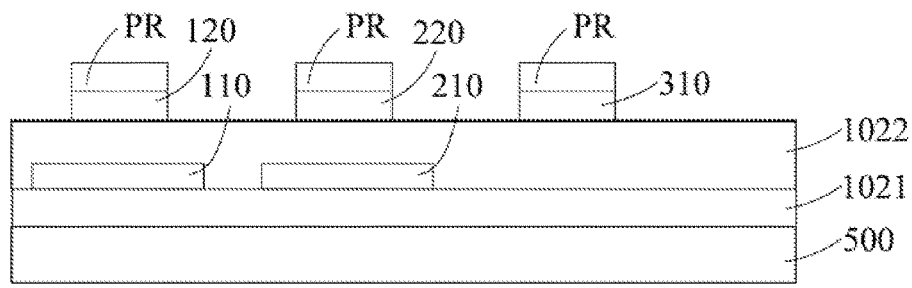

Finally, refer to FIG. 4D, etching away the exposed gate metal layer IM to form the first gate 220, the second gate 120, and the first storage capacitor 310. Wherein, the first gate 220 is opposite to the polysilicon layer 210, the second gate 120 with the metal oxide semiconductor layer 110, and the first gate 220, the second gate 120, and the first storage capacitor 310 are separated from each other.

Figure 2E:
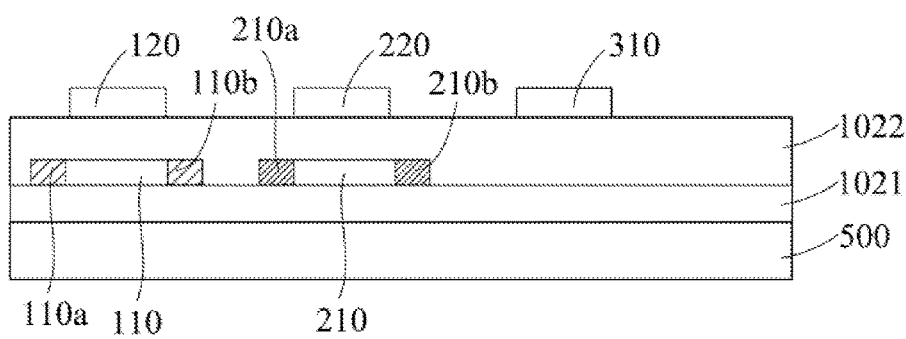
Figure 5A:
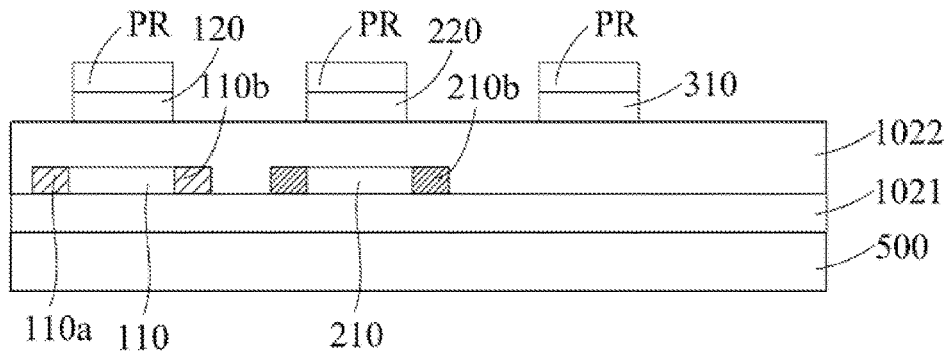
FIG. 5A to 5C are flowcharts of fabrication of a first source contact, a first drain contact, a second source contact, and a second drain contact of the embodiment of the present disclosure.
Figure 5B:
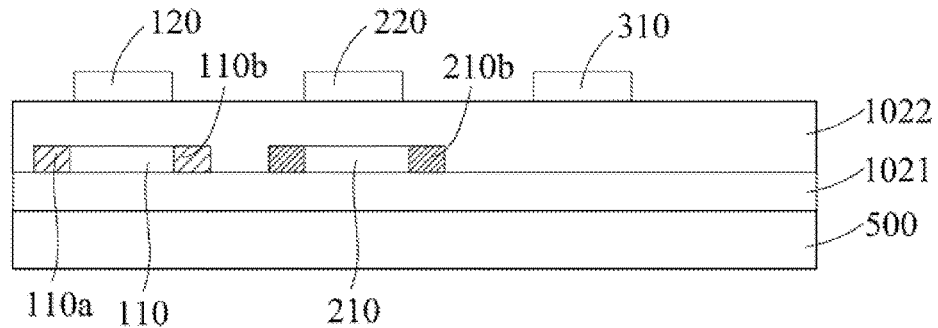
Figure 5C:
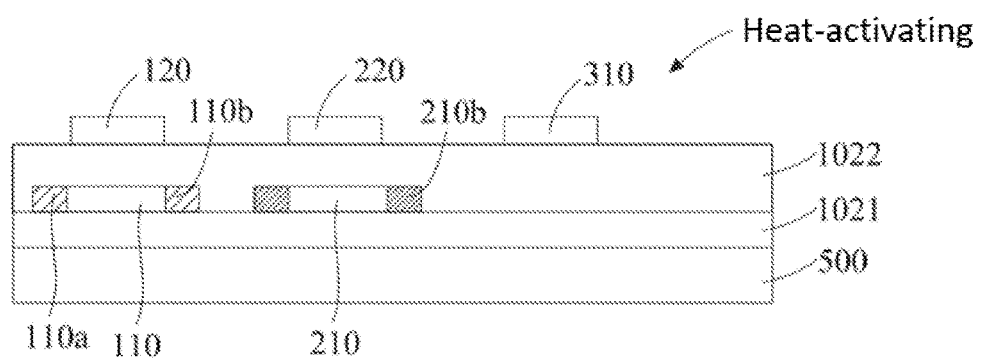

Step 5: refer to FIG. 2E, forming a first source contact portion 210a and a first drain contact portion 210b at both ends of the polysilicon layer 210, and forming a second source contact portion 110a and a second drain contact portion 110b at both ends of the metal oxide semiconductor layer 110. FIG. 5A to 5C are flowcharts of fabrication of a first source contact, a first drain contact, a second source contact, and a second drain contact of the embodiment of the present disclosure.

First, refer to FIG. 5A, ion-implanting both ends of the polysilicon layer 210 and both ends of the metal oxide semiconductor layer 110 at same time. Preferably, boron ions are used for ion implantation, but the present disclosure is not limited thereto. Here, the ion concentration injected at both ends of the polysilicon layer 210 is higher than the ion concentration injected at both ends of the metal oxide semiconductor layer 110, as specifically described in the above-described step three.

Then, refer to FIG. 5B, removing the photoresist PR on the first gate electrode 220, the second gate electrode 120, and the first storage capacitor electrode 310.

Finally, refer to FIG. 5C, heating and activating the polysilicon layer 210 and the metal oxide semiconductor layer 110 after ion implantation, so that the first source contact 210a and the first drain contact 210b are formed at both ends of the polysilicon layer 210, and the second source contact 110a and the second drain contact 110b are formed at both ends of the metal oxide semiconductor layer 110, respectively.

Figure 2F:
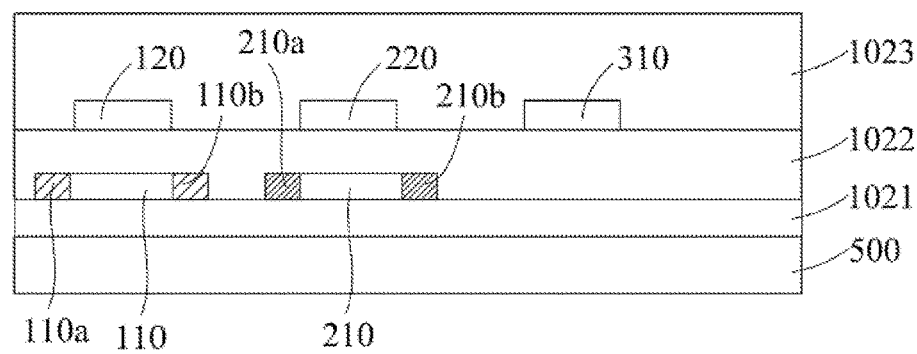

Step 6: refer to FIG. 2F, forming an interlayer insulating layer (ILD) 1023 on the gate insulating layer 1022, the first gate electrode 220, the second gate electrode 120, and the first storage capacitor electrode 310. Here, the interlayer insulating layer 1023 may be, for example, an SiNx/SiOx structure formed on the gate insulating layer 1022, the first gate electrode 220, the second gate electrode 120, and the first storage capacitance electrode 310 by the PECVD process, however, the present disclosure is not limited thereto. For example, the interlayer insulating layer 1023 may be a single-layer SiNx structure or a SiOx structure.

Figure 2G:
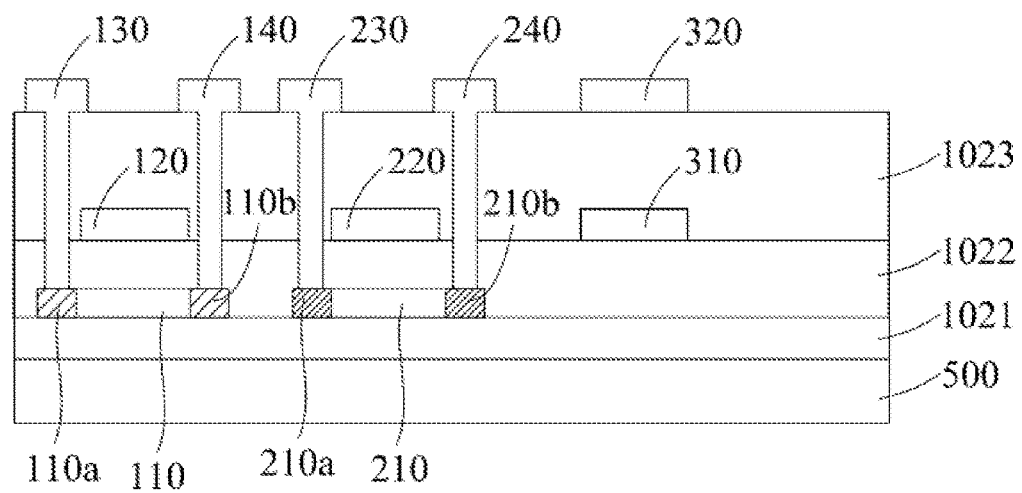

Step 7: refer to FIG. 2G, forming the first source electrode 230, the first drain electrode 240, the second source electrode 130, the second drain electrode 140, and the second storage capacitor electrode 320 on the interlayer insulating layer 1023; the first source electrode 230, the first drain electrode 240, the second source electrode 130 and the second drain electrode 140 penetrate the interlayer insulating layer 1023 and the gate insulating layer 1022 to contact the corresponding first source contact portion 210a, first drain contact portion 210b, second source contact portion 110a and the second drain contact portion 110b, respectively.

Here, the method of fabricating the first source electrode 230, the first drain electrode 240, the second source electrode 130, the second drain electrode 140, and the second storage capacitor electrode 320 is similar to that of the fourth method of manufacturing the first gate electrode 220, the second gate electrode 120, and the first storage capacitor electrode 310, will not repeat here. The first source electrode 230, the first drain electrode 240, the second source electrode 130, the second drain electrode 140, and the second storage capacitor electrode 320 may be a Molybdenum-aluminum-molybdenum (MoAlMo) structure or a Titanium-aluminum-titanium (TiAlTi) structure, or may be a single layer of molybdenum structure or a single layer of aluminum structure.

Figure 2H:
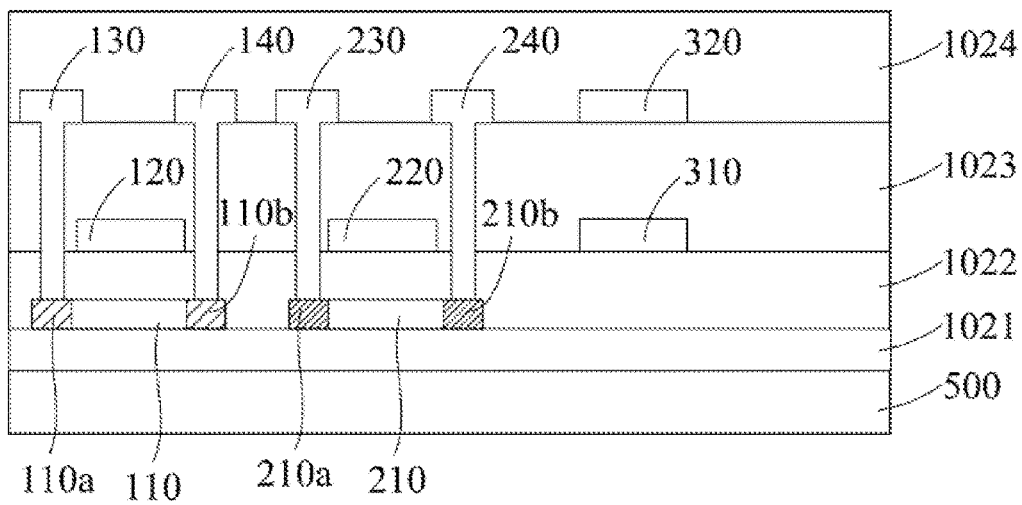

Step 8: refer to FIG. 2H, forming a passivation layer (PV) 1024 on the interlayer insulating layer 1023, the first source electrode 230, the first drain electrode 240, the second source electrode 130, the second drain electrode 140, and the second storage capacitor electrode 320. It is to be noted that, as another embodiment of the present disclosure, step 8 may be omitted if the passivation layer 1024 is not required according to the actual requirements.

Figure 2I:
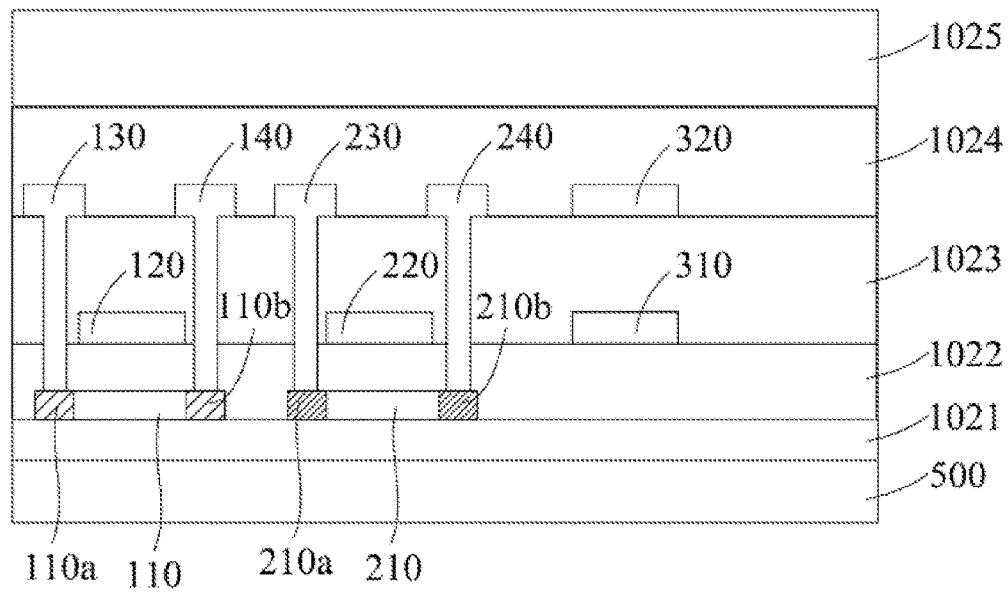

Step 9: refer to FIG. 2I, forming a planarization layer (PLN) 1025 on the passivation layer 1024.

Figure 2J:
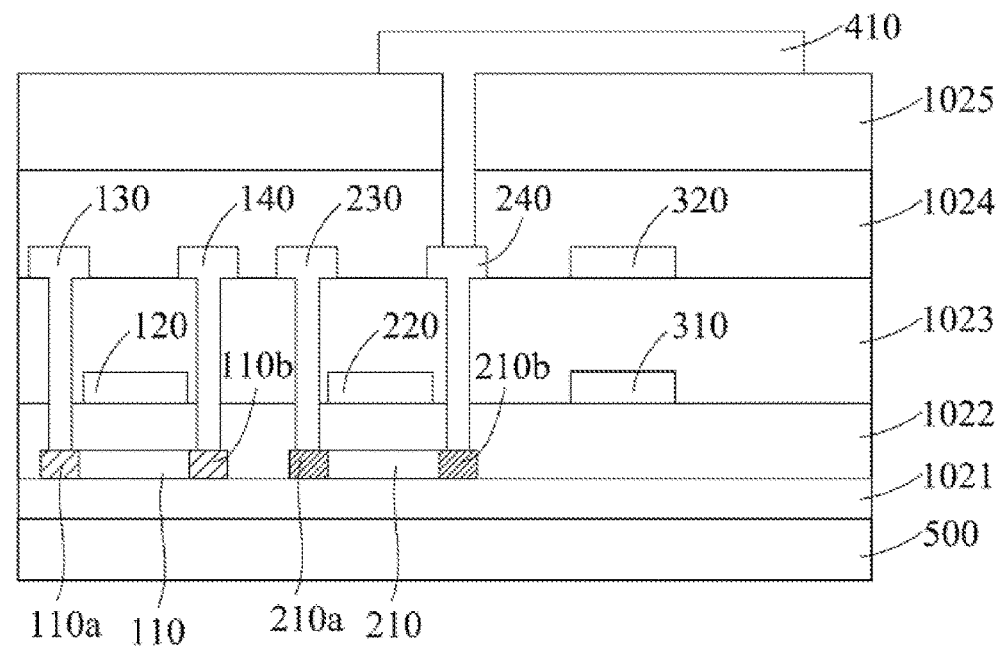

Step 10: refer to FIG. 2J, forming a bottom electrode 410 on the flat layer 1025; the bottom electrode 410 penetrates the flat layer 1025 and the passivation layer 1024 to contact the first drain electrode 240. In the present embodiment, the bottom electrode 410 may be made of indium tin oxide (ITO), for example, the present disclosure is not limited to this, for example, the bottom electrode 210 may also be made of a reflective metal and should be thin enough to have a partial transmittance at the wavelength of the emitted light, which is referred to as translucent.

Figure 2K:
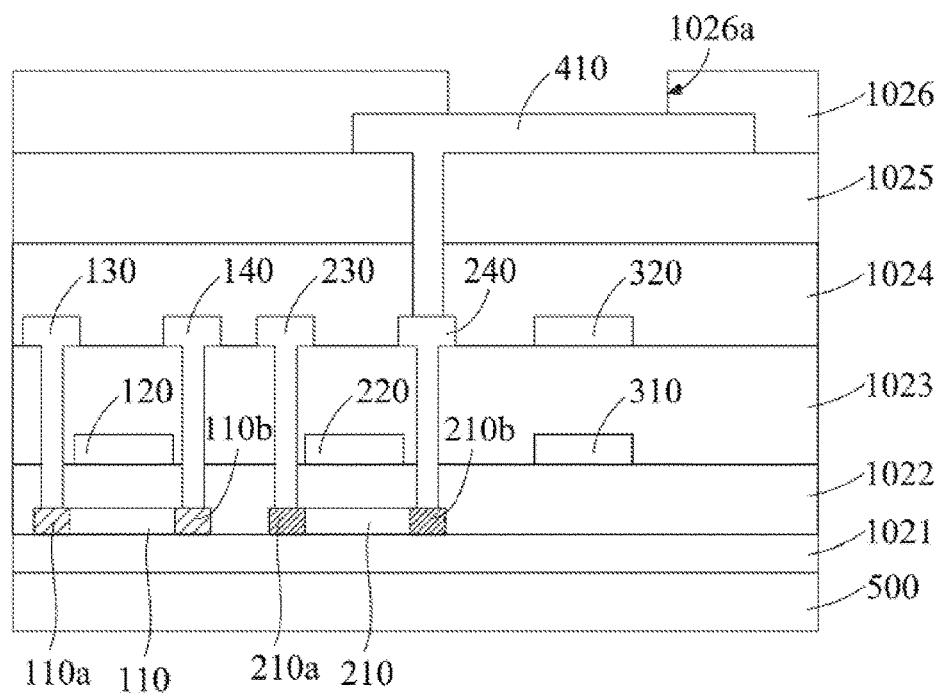

Step 11: refer to FIG. 2K, forming a pixel defining layer (PDL) 1026 on the flat layer 1025 and the bottom electrode 410, and forming a groove 1026a in the pixel limiting layer 1026 to expose the bottom electrode 410.

Figure 2L:
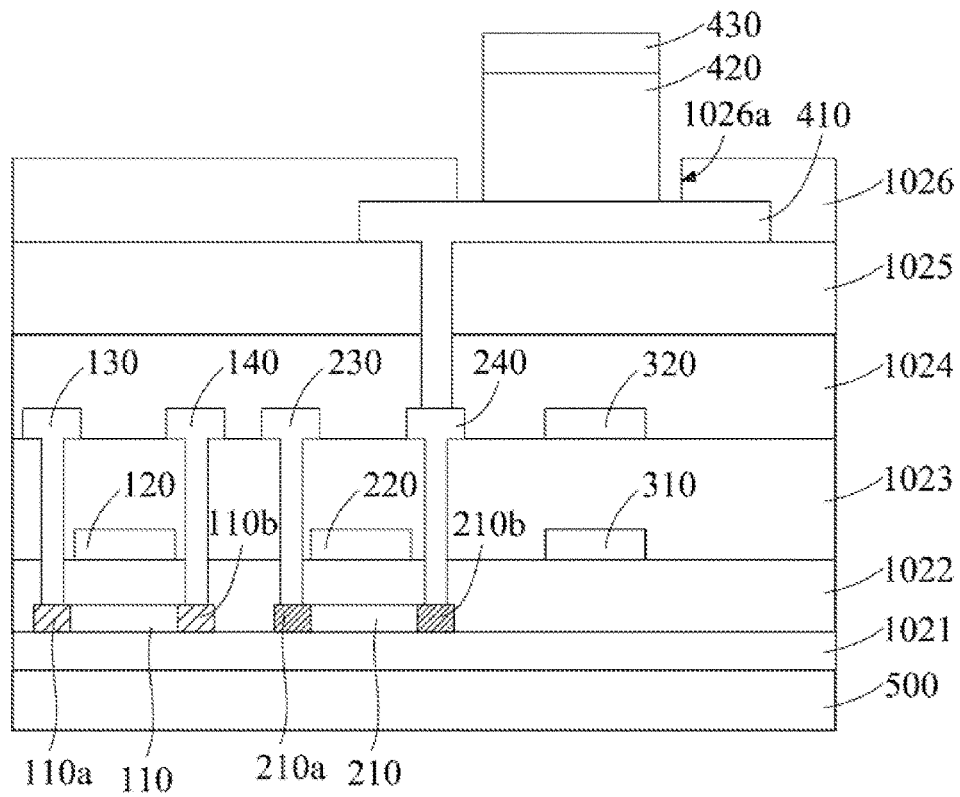

Step 12: refer to FIG. 2L, sequentially forming an organic electroluminescent device 420 and a top electrode 430 on the exposed bottom electrode 410. Here, the organic electroluminescent device 420 sequentially includes a hole injection layer (HIL), a hole transport layer (HTL), a light emitting layer (EML), an electron transport layer (ETL), and an electron injection layer (EIL) from the bottom electrode 410 to the top electrode 430, but the present disclosure is not limited thereto. The top electrode 430 may be made of a reflective metal and should be thick enough so that it is substantially light-tight and a full reflector, but the disclosure is not so limited.

In summary, according to an embodiment of the present disclosure, a low-temperature polysilicon thin film transistor is used as a driving thin film transistor whose drain contacts the bottom electrode of the OLED so that the current supplied to the OLED is stabilized; the metal oxide semiconductor thin film transistor has a low leakage current as a switching thin film transistor for introducing an externally applied voltage signal, and a better circuit closing effect can be achieved. In addition, the metal-oxide-semiconductor thin-film transistor, although poor reliability of light, but its only as a switching thin film transistor light reliability is poor for the entire device is small, and low-temperature polysilicon thin film transistor light reliability is better, so no need to produce a shading layer on the substrate; and both are top-gate structure, it will not increase the process steps, and parasitic capacitance are relatively small.

While the present disclosure has been shown and described with reference to specific embodiments, those skilled in the art will appreciate that various modifications and changes may be made without departing from the spirit and scope of the disclosure as defined by the appended claims and their equivalents, various changes in form and detail may be made therein.

What is claimed is:

1. A method of manufacturing an organic light emitting display panel comprising: a substrate; and a driving thin film transistor, a switching thin film transistor, a storage capacitor, and an organic light emitting device, wherein an external voltage signal is stored in the storage capacitor via the switching thin film transistor; the external voltage signal controls a magnitude of on-current of the driving thin film transistor to control the gray scale of the organic light emitting device; the driving thin film transistor is a low temperature polysilicon thin film transistor; and the switching thin film transistor is a metal oxide semiconductor thin film transistor; the method comprising the following steps:

forming a polysilicon layer and a metal oxide semiconductor layer on a substrate;
forming a gate insulating layer on the substrate, the polysilicon layer and the metal oxide semiconductor layer;
forming a first gate electrode, a second gate electrode and a first storage capacitor electrode on the gate insulating layer;
forming a first source contact and a first drain contact on both ends of the polysilicon layer and forming a second source contact and a second drain contact at both ends of the metal oxide semiconductor layer, respectively;
forming an interlayer insulating layer on the gate insulating layer, the first gate, the second gate, and the first storage capacitor electrode;
forming a first source, a first drain, a second source, a second drain and a second storage capacitor electrode on the interlayer insulating layer; the first source, the first drain, the second source and the second drain penetrating through the interlayer insulating layer and the gate insulating layer to make contact with the corresponding first source contact, first drain contact, second source contact and second drain contact, respectively;
forming a flat layer on the interlayer insulating layer, the first source electrode, the first drain electrode, the second source electrode, the second drain electrode, and the second storage capacitor electrode;
forming a bottom electrode on the flat layer; the bottom electrode penetrating the flat layer to make contact with the first drain;
forming a pixel limiting layer on the flat layer and the bottom electrode, and forming a recess exposing the bottom electrode in the pixel limiting layer; and
sequentially forming an organic electroluminescent device and a top electrode on the exposed bottom electrode.

2. The method of manufacturing an organic light emitting display panel according to claim 1, wherein the low temperature polysilicon thin film transistor is a P type low temperature polysilicon thin film transistor, and the metal oxide semiconductor thin film transistor is an N type metal oxide semiconductor thin film transistor.

3. The method of manufacturing an organic light emitting display panel according to claim 1, further comprising forming a buffer layer on the substrate before forming the polysilicon layer and the metal oxide semiconductor layer on the substrate.

4. The method of manufacturing an organic light emitting display panel according to claim 3, wherein the method of forming the polysilicon layer and the metal oxide semiconductor layer on the substrate comprises the steps of:
depositing an amorphous silicon layer on the substrate;
annealing the amorphous silicon layer to recrystallize, thereby forming a polysilicon layer;
depositing a metal oxide semiconductor layer separated from the polysilicon layer on the substrate.

5. The method of manufacturing an organic light emitting display panel according to claim 3, further comprising, after forming the gate insulating layer on the substrate, the polysilicon layer, and the metal oxide semiconductor layer, thinning a portion of the gate insulating layer opposite to the polysilicon layer or a portion of the gate insulating layer opposite to the metal oxide semiconductor layer.

6. The method of manufacturing an organic light emitting display panel according to claim 3, wherein the method of forming the first gate electrode, the second gate electrode, and the first storage capacitor electrode on the gate insulating layer comprises the following steps:
depositing a gate metal layer on the gate insulating layer;
coating a photoresist on the gate metal layer;
exposing and developing the resist to remove the photo resistance other than the photoresist on the first gate, the second gate, and the first storage capacitor electrode to be formed;
etching away the exposed gate metal layer.

7. The method of manufacturing an organic light emitting display panel according to claim 6, wherein the method of manufacturing the first source contact, the first drain contact, the second source contact and the second drain contact comprises the following steps:
- respectively ion implanting the two ends of the polysilicon layer and the two ends of the metal oxide semiconductor layer;
- removing the photo resistance on the first gate electrode, the second gate electrode and the first storage capacitor electrode;
- heating and activating the polysilicon layer and the metal oxide semiconductor layer after ion implantation, so that the first source contact and the first drain contact are formed at both ends of the polysilicon layer, and the second source contact and the second drain contact are formed at both ends of the metal oxide semiconductor layer, respectively.

8. The method of manufacturing an organic light emitting display panel according to claim 7, wherein, in the step of ion implanting both ends of the polysilicon layer and the two ends of the metal oxide semiconductor layer, the ions used are boron ions.

9. The method of manufacturing an organic light emitting display panel according to claim 1, further forming a passivation layer on the interlayer insulating layer, the first source, the first drain, the second source, the second drain, and the second storage capacitor electrode before forming the flat layer.

10. The method of manufacturing an organic light emitting display panel according to claim 9, wherein the method of forming the polysilicon layer and the metal oxide semiconductor layer on the substrate comprises the steps of:
- depositing an amorphous silicon layer on the substrate;
- annealing the amorphous silicon layer to recrystallize, thereby forming a polysilicon layer;
- depositing a metal oxide semiconductor layer separated from the polysilicon layer on the substrate.

11. The method of manufacturing an organic light emitting display panel according to claim 9, further comprising, after forming the gate insulating layer on the substrate, the polysilicon layer, and the metal oxide semiconductor layer, thinning a portion of the gate insulating layer opposite to the polysilicon layer or a portion of the gate insulating layer opposite to the metal oxide semiconductor layer.

12. The method of manufacturing an organic light emitting display panel according to claim 9, wherein the method of forming the first gate electrode, the second gate electrode, and the first storage capacitor electrode on the gate insulating layer comprises the following steps:
- depositing a gate metal layer on the gate insulating layer;
- coating a photoresist on the gate metal layer;
- exposing and developing the resist to remove the photo resistance other than the photoresist on the first gate, the second gate, and the first storage capacitor electrode to be formed;
- etching away the exposed gate metal layer.

13. The method of manufacturing an organic light emitting display panel according to claim 12, wherein the method of manufacturing the first source contact, the first drain contact, the second source contact and the second drain contact comprises the following steps:
- respectively ion implanting the two ends of the polysilicon layer and the two ends of the metal oxide semiconductor layer;
- removing the photo resistance on the first gate electrode, the second gate electrode and the first storage capacitor electrode;
- heating and activating the polysilicon layer and the metal oxide semiconductor layer after ion implantation, so that the first source contact and the first drain contact are formed at both ends of the polysilicon layer, and the second source contact and the second drain contact are formed at both ends of the metal oxide semiconductor layer, respectively.

14. The method of manufacturing an organic light emitting display panel according to claim 13, wherein, in the step of ion implanting both ends of the polysilicon layer and the two ends of the metal oxide semiconductor layer, the ions used are boron ions.

15. The method of manufacturing an organic light emitting display panel according to claim 1, wherein the method of forming the polysilicon layer and the metal oxide semiconductor layer on the substrate comprises the steps of:
- depositing an amorphous silicon layer on the substrate;
- annealing the amorphous silicon layer to recrystallize, thereby forming a polysilicon layer;
- depositing a metal oxide semiconductor layer separated from the polysilicon layer on the substrate.

16. The method of manufacturing an organic light emitting display panel according to claim 1, further comprising, after forming the gate insulating layer on the substrate, the polysilicon layer, and the metal oxide semiconductor layer, thinning a portion of the gate insulating layer opposite to the polysilicon layer or a portion of the gate insulating layer opposite to the metal oxide semiconductor layer.

17. The method of manufacturing an organic light emitting display panel according to claim 1, wherein the method of forming the first gate electrode, the second gate electrode, and the first storage capacitor electrode on the gate insulating layer comprises the following steps:
- depositing a gate metal layer on the gate insulating layer;
- coating a photoresist on the gate metal layer;
- exposing and developing the resist to remove the photo resistance other than the photoresist on the first gate, the second gate, and the first storage capacitor electrode to be formed;
- etching away the exposed gate metal layer.

18. The method of manufacturing an organic light emitting display panel according to claim 17, wherein the method of manufacturing the first source contact, the first drain contact, the second source contact and the second drain contact comprises the following steps:
- respectively ion implanting the two ends of the polysilicon layer and the two ends of the metal oxide semiconductor layer;
- removing the photo resistance on the first gate electrode, the second gate electrode and the first storage capacitor electrode;
- heating and activating the polysilicon layer and the metal oxide semiconductor layer after ion implantation, so that the first source contact and the first drain contact are formed at both ends of the polysilicon layer, and the second source contact and the second drain contact are formed at both ends of the metal oxide semiconductor layer, respectively.

19. The method of manufacturing an organic light emitting display panel according to claim 18, wherein, in the step of ion implanting both ends of the polysilicon layer and the two ends of the metal oxide semiconductor layer, the ions used are boron ions.

* * * * *